Sept. 12, 1967 F. HOCHBERG ET AL 3,341,375
FABRICATION TECHNIQUE
Filed July 8, 1964 3 Sheets-Sheet 1

INVENTORS
FREDERICK HOCHBERG
ARNOLD REISMAN
BY
Allen A. Meyer, Jr.
ATTORNEY

Sept. 12, 1967 F. HOCHBERG ET AL 3,341,375

FABRICATION TECHNIQUE

Filed July 8, 1964 3 Sheets-Sheet 2

Sept. 12, 1967 F. HOCHBERG ET AL 3,341,375

FABRICATION TECHNIQUE

Filed July 8, 1964 3 Sheets-Sheet 3

3,341,375

FABRICATION TECHNIQUE

Frederick Hochberg and Arnold Reisman, Yorktown Heights, N.Y., assignors to International Business Machines Corporation, New York, N.Y., a corporation of New York Filed July 8, 1964, Ser. No. 381,190
9 Claims. (Cl. 148—175)

Figure 1:

This invention relates to a fabrication technique for n-p-n or p-n-p single crystal field effect transistors. More particularly, this invention enables the formation of many such devices on a single crystal substrate of silicon employed to form integrated circuits since the reduction of device yield due to electrical shorting of source and drain is virtually eliminated.

As conventionally fabricated, taking for example n-p-n structures of the type being discussed, one begins with a substrate wafer of single crystal silicon. Silicon dioxide is affixed to the surface of the wafer, for example, by evaporation of silicon dioxide, thermal oxidation of silicon itself in oxygen or a mixture of oxygen and water vapor, etc., and a photoresist mask is applied in a pattern over the silicon dioxide layer. The mask is so patterned that areas which will subsequently become the source and the drain of the field effect transistor device are left exposed. The silicon dioxide in these exposed areas is etched away with hydrogen fluoride down to the silicon substrate. An n diffusion is then conducted with phosphorus, arsenic, or antimony to form the source and drain regions with a p region between them. This p region lying between the source and the drain formed as a result of n diffusion will subsequently become the rate region, or conductor channel, of the field effect transistor device. Inherently, the technique as previously employed suffers from three defects. (a) Since two windows are left open in the mask, there are four edges whose lack of resolution will influence the width of the source and the drain and, more importantly, the width of the gate lying between the source and the drain. (b) During the diffusion process for forming the source and the drain, two separate diffused regions are being generated which tend to spread as they enter the bulk of the silicon, the probability of these two diffused regions shorting out with one another, especially if narrow gate widths are desired, becomes increasingly more probable. Since there is great advantage in field effect devices having narrow gate widths and since in using such devices to form integrated circuits on a single crystal substrate wafer, high device yields are necessary, the problem of source-drain shorting is a serious one. (c) Because it is highly desirable to achieve maximum electrical isolation of the devices fabricated on the same substrate, it would be desirable to utilize silicon of very high resistivity as a substrate. Frequently, however, it is more practical to utilize silicon of relatively low resistivity as a substrate. When such is done, however, device isolation is not satisfactory. The commonly employed techniques for fabricating field effect transistor devices generally starts with 0.5–10 ohm-centimeter p type silicon because it is more readily available than high resistivity material. As a consequence, device isolation is generally poor. Furthermore, the reproducibility of substrate material must be high, entailing considerable expense in quality control of substrate material.

The process of the present invention provides a technique for fabricating field effect transistor devices for use in either integrated or non-integrated circuits which permit formation of gate regions, or conduction channels, whose widths are limited only by the resolution of a single line formed during a masking operation, which virtually eliminates any possibility of source-drain shorting and which when required in conjunction with the fabrication of integrated circuits provides a means of achieving maximum device isolation consistent with the use of silicon as a substrate. In addition, the quality of the substrate need not be very good or reproducible since the gate characteristics are determined during the fabrication process.

It is an object of the invention to fabricate single crystal field effect transistors.

It is another object of the invention to fabricate n-p-n or p-n-p single crystal field effect transistors.

It is a further object of the invention to fabricate n-p-n or p-n-p single crystal field effect transistors having a minimum gate width.

It is still a further object of the invention to fabricate n-p-n or p-n-p single crystal field effect transistors having a minimum gate width such that reduction of yield due to shorting of source and drain regions is virtually eliminated.

It is still another object of the invention to fabricate n-p-n or p-n-p single crystal field effect transistors in isolated arrays.

The foregoing and other objects, features and advantages of the invention will be apparent from the following more particular description of a preferred embodiment of the invention, as illustrated in the accompanying drawings.

FIGURES 1–14 illustrate the sequence for fabricating field effect transistors according to the process of the invention. For simplicity only three field effect transistor devices are depicted.

Figure 2:
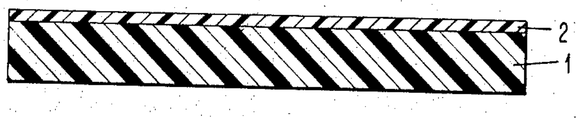
Figure 3:
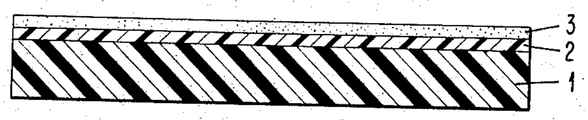
Figure 4:
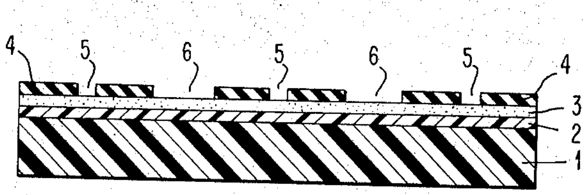

As a starting point in the process one requires a p type silicon substrate 1 (FIG. 1) upon which has been deposited an n type silicon epitaxial layer 2 as shown in FIGURE 2. The epitaxial layer may be formed by conventional vapor growth methods as, for example, the reduction of silicon tetrachloride by hydrogen at 1200° C. to 1250° C. The n dopant is introduced during the vapor growth process in the form of phosphine or arsine in sufficient amounts to provide a carrier concentration in the epitaxial layer of approximately $5\times10^{17}$ electrons per cubic centimeter. The epitaxial layer is grown 3–5 microns thick. The use of n type epitaxial overgrowth on the p type substrate makes the nature of the substrate in terms of its resistivity or mobility immaterial, unlike conventional field effect techniques which require close control of substrate characteristics entailing increased expense in raw materials. The process of the present fabrication method enables one to tailor the characteristic without concern for the characteristics of the p substrate material. Furthermore, as will become evident, when the gate region has been formed via the process of the present invention, the breakdown voltages obtained are much greater than would have been obtained by conventional methods. Following the epitaxial process, the surface of the silicon is oxidized by conventional oxidation techniques to form an $SiO_2$ layer 3 as shown in FIG. 3, preferably by the use of oxygen at 1050° C., flowing at 2 liters per minute for 16 hours. With reference to FIG. 4, a pattern 4 composed of KPR (Kodak Photo Resist) is formed over this $SiO_2$ layer 3. The main feature of the KPR pattern is that the gate region is represented by a single narrow gate line pattern 5, eliminating the need for attempting to control the width of the gate by the precision with which source and drain line openings in the pattern can be formed. This latter approach is the conventional one and seriously limits the smallest gate width that can be achieved on two counts:

(1) Since there exist resolution limitations in any photoresist process, the spacing of lines, due to undercutting and resolution fuzzyness, limits the distance between such lines to approximately two to three microns even though the line thickness itself may be much smaller than this.

(2) Having formed adjacent lines through which an impurity is to be diffused, the distance between the lines must be such that the diffusion fronts of the impurities emanating from the region of each line must not intersect one another else the regions will short.

Since in the process of the present invention only the gate is to be diffused, the gate width is limited only by the thickness with which a line can be formed in a photographic process and not by the minimum spacing that can be achieved between two lines. Furthermore, as only a single diffusion front is formed, it cannot possibly short out. Again with reference to FIG. 4, it will be noted that an additional, broad isolation line pattern 6 is formed at the extremities of what is to become a field effect transistor. This latter line pattern is not critical in terms of dimensions since it serves only as a diffusion entrance for isolating adjacent devices if integrated circuits are to be fabricated. The broad line pattern 6 in no way effects gate width, and since source and drain widths do not effect functioning of the device, the precision of formation of this second line pattern is inconsequential. In the event that one only requires single devices which are to be employed in conventional circuits, the second line pattern need not be formed at all.

Figure 5:
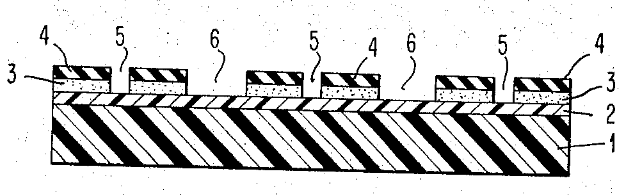
Figure 6:
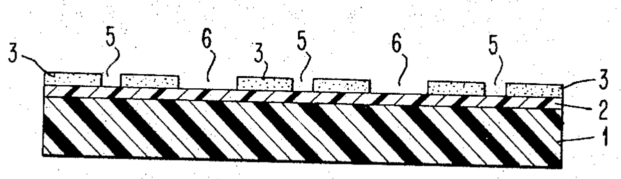

In FIG. 5, the $SiO_2$ underneath the line patterns 5 and 6 has been etched away with buffered HF. The photoresist film 4 has been removed by conventional methods in FIG. 6.

Figure 7:
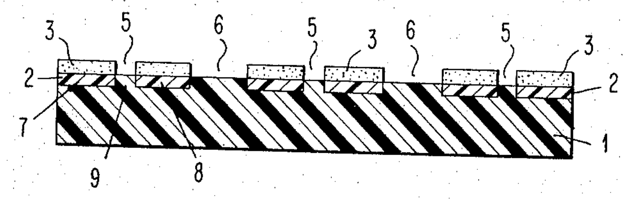

Now the boron is diffused into the sample, FIG. 7, through the line patterns formed after the $SiO_2$ underneath the line patterns has been etched away and the photoresist film has been removed. The boron diffusion is conducted in such a manner that the gate region 5 as well as the isolation channel 6 (if the latter is required) intercepts the p substrate. For the epitaxial layer thickness mentioned above, a boron diffusion using $B_2O_3$ at 1250° C. for four hours represents a preferable set of conditions.

Figure 8:
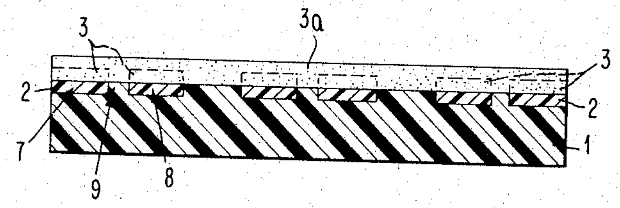
Figure 13:
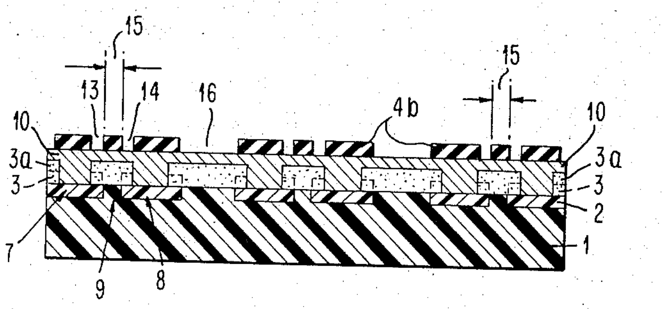

Having formed the source 7, drain 8, and gate 9 regions as shown in FIG. 7, a second layer 3*a* of silicon dioxide of 1,000 to 5,000 angstroms thick is deposited on the surface leading to the situation depicted in FIG. 8. For purposes of continuity, the two silicon dioxide layers 3 and 3*a* are differentiated from each other although in actuality they are continuous. A pattern of KPR 4*a* is then formed over the surface in the manner shown in FIG. 9 and the silicon dioxide in the open portions of the pattern are etched away with buffered HF leading to the status shown in FIG. 10 in which source 7 and drain 8 regions are exposed and in which the gate 9 region is overlayed by $SiO_2$. The KPR pattern 4*a* is then removed leading to the structure depicted in FIG. 11. Aluminum 10 is then evaporated on the entire surface resulting in the structure shown in FIG. 12. Another pattern of KPR 4*b* in the form shown in FIG. 13 is deposited. The aluminum in the open portions of KPR pattern 4*a* is then etched away with NaOH solution after which the KPR pattern is removed and the final structure shown in FIG. 14 results. It will be noted that the aluminum directly contacts the source and the drain regions but that it is insulated from the gate by $SiO_2$ as in conventional field effect structures. These latter are commonly referred to as insulated gate field effect transistors, designated FET. Such structures are useful as interconnected isolated devices or integrated devices in computer logic circuits.

EXAMPLE I

A 1 ohm-centimeter 1 inch diameter by 10 mils thick wafer of "P" type silicon is lapped with $Al_2O_3$ and chemically polished with a mixture of nitric acid, acetic acid and hydrofluoric acid. A 3 micron thick epitaxial layer of silicon is grown on this polished substrate at 1200° C. using silicon tetrachloride in the presence of hydrogen.

Figure 9:
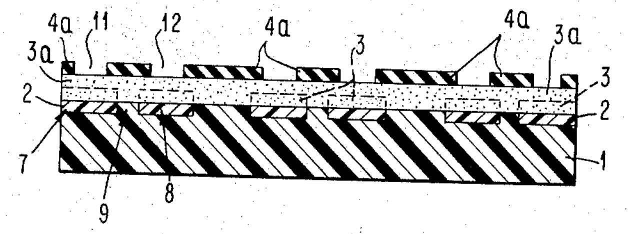
Figure 10:
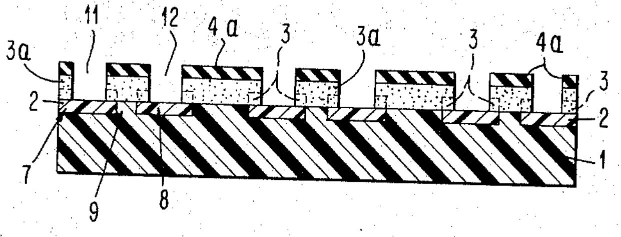
Figure 11:
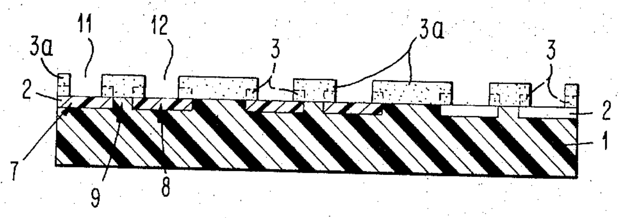
Figure 12:
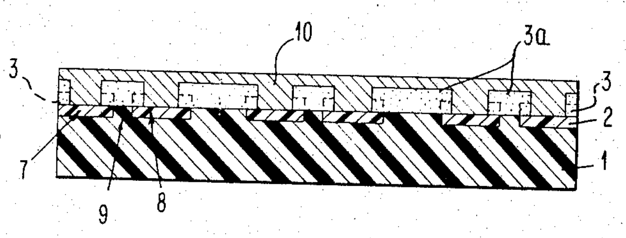
Figure 14:
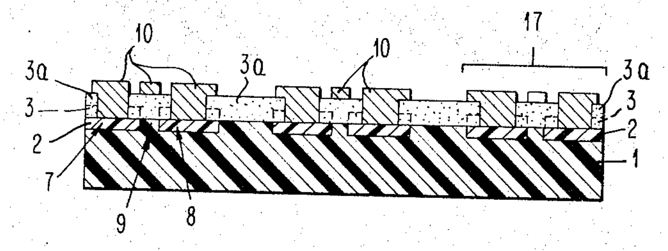

The silicon tetrachloride as purchased contains the proper quantity of N type impurity in the form of arsenic trichloride to provide a carrier concentration of $3\times10^{17}$ electrons per cubic centimeter in the grown epitaxial layer. The surface of the silicon is then oxidized at 1050° C. in a stream of oxygen flowing at a rate of 2 liters per minute for 16 hours to form a $SiO_2$ layer, FIG. 3. A KPR pattern 4 is overlaid upon the $SiO_2$ layer as shown in cross-section in FIG. 4. The narrow line pattern 5 which subsequently becomes the gate has a width of 2 microns. The isolation line pattern 6 has a width 30 mils. The gate and isolation line patterns (5 and 6 respectively) are etched out with hydrofluoric acid buffered with ammonium fluoride. The KPR pattern 4 is removed and the sample is diffused with boron at 1200° C. for four hours, following which a second silicon oxidation is conducted at 970° C. for 165 minutes. A second KPR pattern 4*a* is then affixed as shown in FIG. 9 with electrode line patterns 11 and 12 having widths of 2 mils. These line patterns are etched out with buffered hydrofluoric acid as above and the KPR is removed. Aluminum 10 is then evaporated on surface at 200° C. to a thickness of 10,000 angstroms. A final KPR pattern 4*b* is affixed as shown in FIG. 13 with electrode line pattern widths 13 and 14 again being 2 mils and the spacing 15 between the electrode line patterns being 4 microns, and the line pattern width 16 between devices being 20 mils. The aluminum in all the open line patterns 13, 14, 16 is etched away with 20% by weight sodium hydroxide solution. The KPR pattern 4*b* is removed and the finished devices 17 are as shown in FIG. 14.

These devices exhibit a breakdown voltage of 100 volts and a transconductance $$G_M=\frac{\text{change in source drain current}}{\text{change in gate voltage}}$$

of 5,000 micromhos with a channel length to width ratio of 50.

EXAMPLE II

The process of Example I is repeated except that a p conductivity type epitaxial layer is deposited from $SiCl_4$ and hydrogen containing $BCl_3$ as a dopant on an "n" conductivity type silicon substrate and an "n" conductivity type impurity phosphorus is diffused into the gate region at 1050° C. for one hour. All the remaining steps are conducted as set forth in Example I.

The devices produced exhibit a breakdown voltage of 100 volts and a $G_M$=5,000 micromhos.

Thus, the insulated gate field effect transistors fabricated according to the process of the invention eliminate electrical shorting between the source and drain thus improving device yield materially. In addition, the use of an epitaxial layer in conjunction with a diffusion process enables tailoring of the gate characteristics independent of the substrate characteristics and provides a means of simultaneously achieving device isolation.

While the invention has been particularly shown and described with reference to a preferred embodiment thereof, it will be understood by those skilled in the art that various changes in form and detail may be made without departing from the spirit and scope of the invention.

What is claimed is:

1. A process for fabricating an insulated gate field effect transistor comprising the steps of:

forming a semiconductor layer of first conductivity type onto a substrate;

introducing a dopant material through a central portion of said layer to convert said central portion throughout to second conductivity type and form p-n junctions therebetween and the remaining portions of said layer, said central portion of said layer defining a gate region and said remaining portions of said layer defining source and drain regions, respectively;

forming a thin insulating layer at least over said central portion of said layer; and depositing a thin film metallic pattern over said insulating layer and registered with said central portion of said layer.

2. The process of claim 1 comprising the additional step of introducing said dopant through selected portions of said remaining portions of said layer removed from said p-n junctions to convert said selected portions to said second conductivity type whereby said source and drain regions are defined.

3. The process of claim 1 comprising the further step of forming said substrate of semiconductor material of said second conductivity type.

4. The process of claim 3 comprising the additional step of epitaxially depositing said layer onto said substrate.

5. The process of claim 3 wherein said layer is of n-type conductivity and said substrate is of p-type conductivity and said dopant is boron.

6. The process of claim 3 wherein said layer is of p-type conductivity and said substrate is of n-type conductivity and said dopant is phosphorus.

7. A process for fabricating an insulated gate field effect transistor comprising source, drain, and gate regions comprising the steps of:

forming a semiconductor layer of first conductivity type onto a substrate of second conductivity type;

positioning a diffusion mask over said layer and patterned to expose selected surface portions of said layer defining said gate region, remaining surface portions of said layer adjacent said selected surface portions defining said source and drain regions, respectively;

diffusing a dopant through said diffusion mask to convert said selected surface portions of said layer throughout to said second conductivity type whereby said selected surface portions define p-n junctions with each of said remaining portions;

forming a thin insulating layer over said selected surface portions of said layer; and depositing a thin film metallic pattern over said thin insulating layer registered with said selected surface portions of said layer.

8. The process of claim 7 wherein said layer is formed of silicon and comprising the additional step of oxidizing the surface of said layer to form a thin oxide coating thereover, and removing portions of said oxide coating over said selected surface portions of said layer to define said diffusion mask.

9. The process of claim 7 comprising the further steps of positioning said diffusion mask over said layer to expose said selected surface portions and, also, portions of said remaining surface portions removed from said p-n junctions whereby said diffusion mask is effective to dimension said source and drain regions; and concurrently diffusing said dopant through said diffusion mask and into said selected surface portions and said portions of said remaining surface portions.

References Cited

UNITED STATES PATENTS

| | | | |
|---|---|---|---|
| 2,815,462 | 12/1957 | Auphan | 148—174 |
| 2,970,896 | 2/1961 | Cornelison et al. | 148—186 |
| 3,121,808 | 2/1964 | Kahng et al. | 148—175 |
| 3,165,811 | 1/1965 | Kleimack et al. | 148—175 |
| 3,193,418 | 7/1965 | Cooper et al. | 148—174 |

OTHER REFERENCES

Van Ligten: "Epitaxially Diffused Transistor Fabrication," IBM Technical Disclosure Bulletin, vol. 4, No. 10, March 1962, pp. 58–59.

DAVID L. RECK, *Primary Examiner.*

N. F. MARKVA, *Assistant Examiner.*